US008587305B2

(12) United States Patent
Madhuranthakam et al.

(10) Patent No.: US 8,587,305 B2
(45) Date of Patent: Nov. 19, 2013

(54) SYSTEM AND METHOD FOR FAT SUPPRESSION IN CHEMICAL SHIFT BASED WATER-FAT SEPARATED MR IMAGING

(75) Inventors: Ananth J. Madhuranthakam, Jamaica Plain, MA (US); Huanzhou Yu, Sunnyvale, CA (US); David C. Alsop, Newton, MA (US)

(73) Assignees: General Electric Company, Schenectady, NY (US); Beth Israel Deaconess Medical Center, Boston, MA (US)

( * ) Notice: Subject to any disclaimer, the term of this patent is extended or adjusted under 35 U.S.C. 154(b) by 526 days.

(21) Appl. No.: 13/004,147

(22) Filed: Jan. 11, 2011

(65) Prior Publication Data
US 2012/0176131 A1 Jul. 12, 2012

(51) Int. Cl.
*G01V 3/00* (2006.01)
*G06K 9/00* (2006.01)

(52) U.S. Cl.
USPC .......................................... 324/307; 382/128

(58) Field of Classification Search
USPC .................. 324/307, 309, 312, 314; 382/128
See application file for complete search history.

(56) References Cited

U.S. PATENT DOCUMENTS

| 6,147,492 A * | 11/2000 | Zhang et al. ................... 324/309 |
| 6,466,014 B1 | 10/2002 | Ma |
| 6,856,134 B1 | 2/2005 | Reeder et al. |
| 7,592,810 B2 * | 9/2009 | Reeder et al. ................. 324/309 |
| 7,916,909 B2 * | 3/2011 | Khazen et al. ................ 382/128 |
| 8,000,769 B2 * | 8/2011 | Yu et al. ........................ 600/410 |
| 8,488,859 B2 * | 7/2013 | Gilson .......................... 382/131 |
| 2009/0261823 A1 | 10/2009 | Yu et al. |
| 2012/0268120 A1 * | 10/2012 | Hernando ..................... 324/309 |

OTHER PUBLICATIONS

Ma, "Breath-Hold Water and Fat Imaging Using a Dual-Echo Two-Point Dixon Technique With an Efficient and Robust Phase-Correction Algorithm," Magnetic Resonance in Medicine, vol. 52, 2004, pp. 415-419.

Reeder et al., "Iterative Decomposition of Water and Fat With Echo Asymmetry and Least-Squares Estimation (IDEAL): Application With Fast Spin-Echo Imaging," Magnetic Resonance in Medicine, vol. 54, 2005, pp. 636-644.

Yu et al., "Multiecho Water-Fat Separation and Simultaneous R*2 Estimation With Multifrequency Fat Spectrum Modeling," Magnetic Resonance in Medicine, vol. 60, 2008, pp. 1122-1134.

* cited by examiner

*Primary Examiner* — Louis Arana
(74) *Attorney, Agent, or Firm* — Ziolkowski Patent Solutions Group, SC

(57) ABSTRACT

An apparatus and method for separating the NMR signal contributions from a plurality of different species having different chemical shifts is disclosed. The apparatus acquires MR image data sets including a first species signal and a second species signal, generates a first species image from the acquired MR image data, and generates a second species image from the acquired MR image data. The apparatus also identifies voxels in the second species image representative of only the second species and, for voxels identified as being representative of only the second species, calculates a fraction of the second species signal appearing in the first species image. The apparatus generates a modified first species image based on the fraction of the second species signal appearing in the first species image, with the modified first species image having a different fraction of the second species as compared to the first species image.

22 Claims, 4 Drawing Sheets

SYSTEM AND METHOD FOR FAT SUPPRESSION IN CHEMICAL SHIFT BASED WATER-FAT SEPARATED MR IMAGING

BACKGROUND OF THE INVENTION

Embodiments of the invention relate generally to systems and methods of nuclear magnetic resonance (NMR) imaging, more particularly, to a system and method for separating the NMR signal contributions from a plurality of different species having different chemical shifts.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

Magnetic resonance imaging (MRI) is a medical imaging modality that offers remarkable image contrast between soft tissues such as fat and muscle. While this soft tissue contrast is typically the hallmark of MRI, the substantially bright signal attributed to fat often causes difficulties when imaging regions of the body that may be obscured by fat containing tissues. This can impair clinical diagnoses, however, so techniques for separating the MR signal from water and fat and suppressing the fat were developed.

A majority of techniques employed for water-fat decomposition and suppressing the fat have been developed to assume a relatively simple signal representation that models both water and fat as a single resonant frequency at approximately 3.5 ppm (210 Hz at a field strength of 1.5 Tesla and 420 Hz at a magnetic field strength of 3.0 Tesla) away from the water resonant frequency. Exemplary methods of conventional fat suppression include inversion recovery, spectral saturation ("FatSat"), and chemical-shift based multipoint Dixon methods. However, each existing/conventional method of fat suppression has limitations and drawbacks associated therewith. With respect to inversion recovery methods, such as short-tau inversion recovery (STIR), such methods suffer from reduced SNR and have mixed contrast with $T_1$-dependence. With respect to spectral saturation techniques, such as a Chemical Shift Selective Imaging Sequence (CHESS) or "FatSat", such methods provide non-uniform suppression and fail in the areas of high $B_0$ inhomogeneities, particularly in large field-of-view and off-isocenter imaging. With respect to chemical-shift based multipoint Dixon methods, a variety of methods have been developed, including 2-point, 3-point, and other multi-point Dixon methods. One variant of a multi-point Dixon method is IDEAL, as described in U.S. Pat. No. 6,856,134, in which pulse sequences are employed to acquire multiple images at different echo times (TE), and an iterative linear least squares approach is used to estimate the separate water and fat signal components. However, the IDEAL method, like all other Dixon methods, models the fat signal as having one resonant frequency. While water is well modeled by a single resonant frequency, it is well known that fat has a number of spectral peaks. Thus, when fat is modeled by a single frequency, only the main fat peak will be resolved, while the remaining peaks will manifest partly as a baseline level of signal within adipose tissue, appearing as "grey fat" on the separated water images.

Recently, a multi-frequency fat spectrum model was developed for imaging spin species such as fat and water, as described in U.S. Pat. App. Pub. No. 2009/0261823. The multi-frequency fat spectrum model employs a 3-point chemical-shift based technique to completely suppress the fat signal from the water images. While such a technique acts to completely suppress the fat, so as to eliminate the "grey fat" on the separated water images, it is recognized that such a technique does have its limitations. Specifically, as the multi-frequency fat spectrum model employs a 3-point chemical-shift based technique, at least 3 separate echoes for water-fat separation need to be acquired, thereby necessitating a longer acquisition time. That is, the need to acquire at least 3 separate echoes for water-fat separation is limiting and is seen as being undesirable in that it leads to an increased pulse sequence and scan time as compared to a 2-point technique, for example.

Therefore, it would be desirable to provide a system and method for separating the NMR signal contributions from a plurality of different species having different chemical shifts, such as water and fat. It would also be desirable for the system and method to provide improved fat suppression in the water images so as to eliminate "grey fat" and increase contrast in the water images. It would further be desirable for the system and method to provide such fat suppression in an automated and time efficient manner.

BRIEF DESCRIPTION OF THE INVENTION

In accordance with one aspect of the invention, an MRI apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images of an object composed of at least a first species and a second species. The MRI apparatus also includes a computer programmed to cause the MRI system to apply a pulse sequence, acquire a plurality of MR image data sets including a first species signal and a second species signal, generate a first species image from the acquired MR image data, and generate a second species image from the acquired MR image data. The computer is also programmed to identify voxels in the second species image representative of only the second species and, for voxels identified as being representative of only the second species, calculate a fraction of the second species signal appearing in the first species image. The computer is further programmed to generate a modified first species image based on the fraction of the second species signal appearing in the first species image, the modified first species image having a different fraction of the second species as compared to the first species image.

In accordance with another aspect of the invention, a non-transitory computer readable storage medium is provided having stored thereon a computer program comprising instructions, which when executed by a computer, cause the computer to acquire multi-echo MR image data from a subject containing at least a first species and a second species and reconstruct a first species image from the acquired MR image data, the first species image having a suppressed signal from the second species. The instructions further cause the computer to reconstruct a second species image from the acquired MR image data that has a suppressed signal from the first species and further suppress the signal from the second species in the first species image to generate a modified first species image. The suppressing of the signal from the second species in the first species image further includes identifying voxels in the second species image representative of only the second species, calculating a fraction of the second species signal appearing in the first species image for those voxels identified as being representative of only the second species, and subtracting from the first species image, the fraction of the second species signal appearing in the first species image to generate the modified first species image.

In accordance with yet another aspect of the invention, a method for producing an image having a suppressed signal from a selected species with a magnetic resonance imaging (MRI) system includes acquiring, with an MRI system, multi-echo MR data for a subject containing at least a first species and a second species, the multi-echo MR data including a first species signal and a second species signal and reconstructing a first species image and a second species image from the acquired MR image data. The method also includes identifying voxels in the second species image representative of only the second species and calculating, for voxels identified as being representative of only the second species, a fraction of the second species signal component present in the second species image and appearing in the first species image. The method further includes generating a refined first species image based on the fraction of the second species signal component present in the second species image and appearing in the first species image.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

A system and method is provided for separating the NMR signal contributions from a plurality of different species having different chemical shifts. According to embodiments of the invention, a technique is performed to achieve complete fat suppression in water-only MR images acquired by chemical-shift based water-fat separation methods. The technique can be employed on all chemical-shift based imaging methods including 2-point, 3-point, and more than 3 points, with the complete fat suppression provided by the technique increasing the contrast between water and fat in the water-only images.

While embodiments of the invention are described below with respect to a technique for water-fat separation and fat suppression, it is recognized that such a technique can also be employed for suppressing signals of other selected species besides water and fat. As such, the scope of embodiments of the invention is not meant to be limited merely to water-fat separation and fat suppression, but also encompasses other species for which signal separation/suppression in MR imaging may be desirable.

Figure 1:
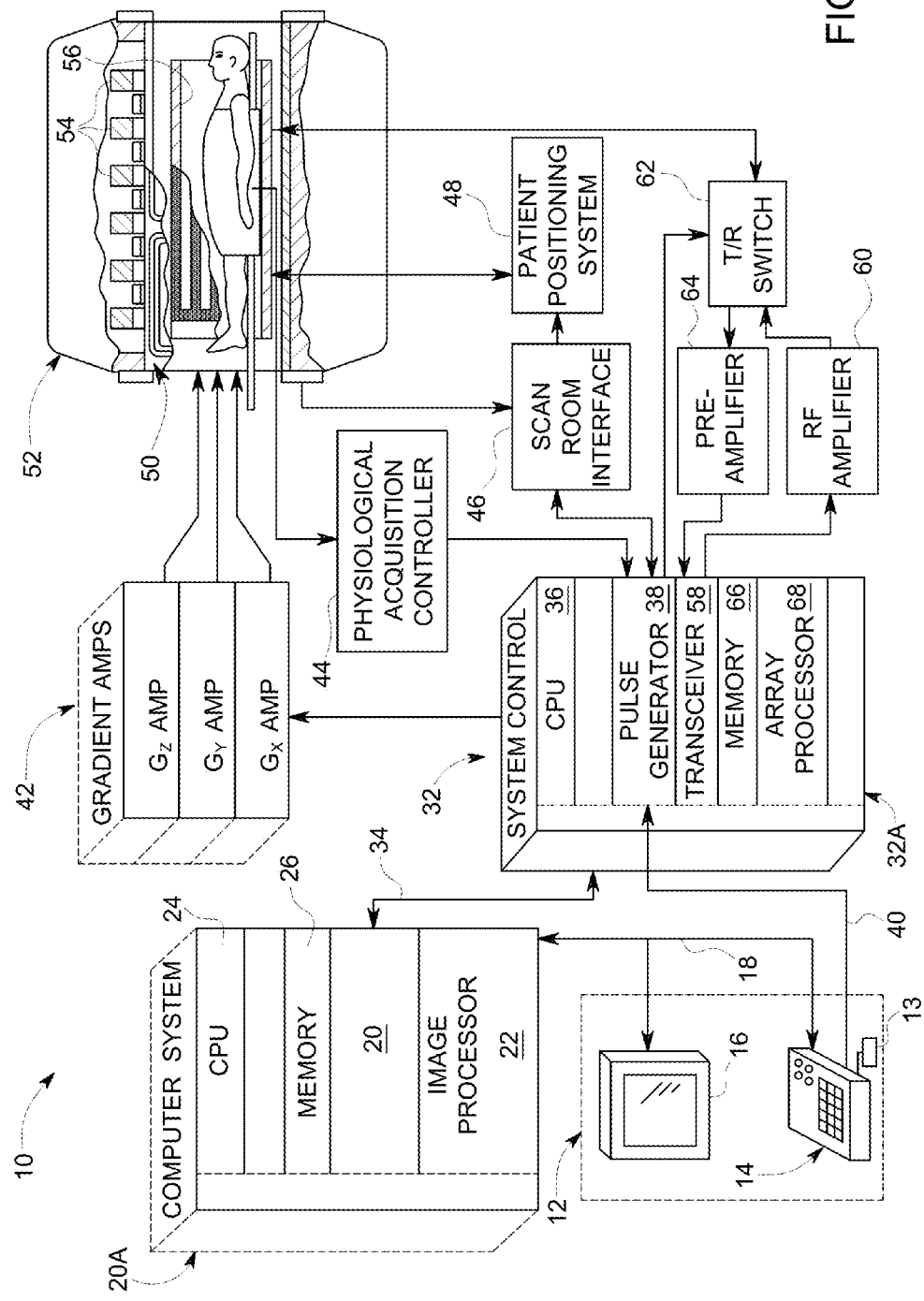
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

As set forth above, the pulse generator module 38 operates the system components to carry out a desired scan sequence and produces data which indicates the timing, strength and shape of the RF pulses produced, and the timing and length of the data acquisition window, with the pulse generator module 38 connecting to a set of gradient amplifiers 42 to indicate the timing and shape of the gradient pulses that are produced during the scan. The following discussion considers an exemplary spin echo pulse sequence employed by pulse generator module 38 that is suitable for use with embodiments of the invention. It should be understood, however, that embodiments of the invention may employ other pulse sequences, as will be apparent to one skilled in the art.

Figure 2:
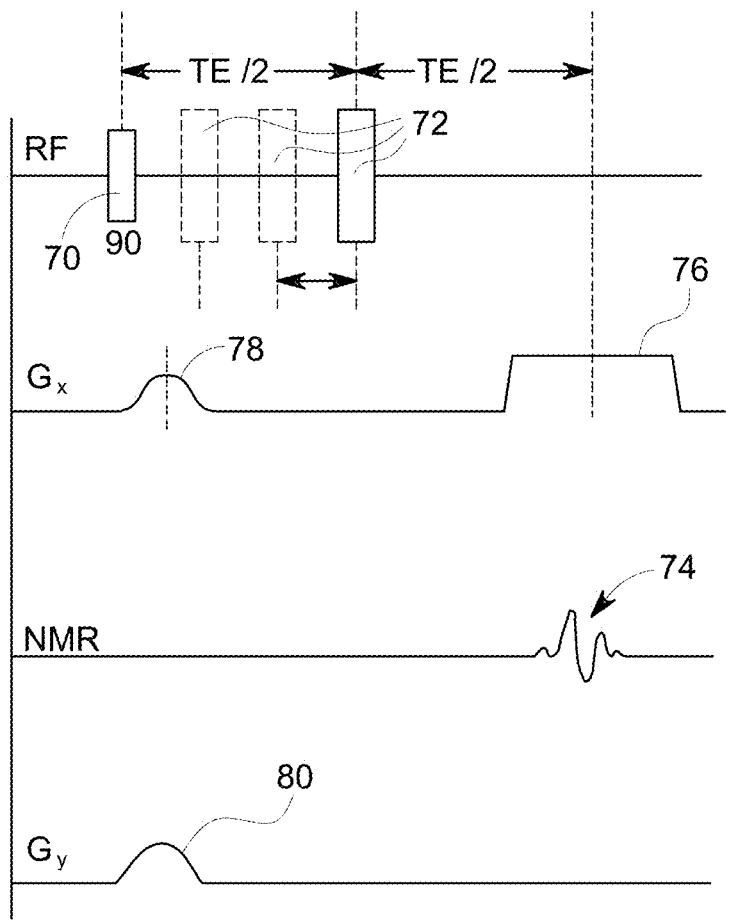
FIG. 2 is a graphical representation of an exemplary pulse sequence executed by the MRI system of FIG. 1 for use with an embodiment of the invention.

Referring to FIG. 2, a spin echo pulse sequence begins with the transmission of a narrow bandwidth radio frequency (F) pulse 70. The energy and the phase of this initial RF pulse 70 may be controlled such that at its termination, the magnetic moments of the individual nuclei are precessing around the z axis within the x-y plane. A pulse of such energy and duration is termed a 90 degree RF pulse.

The result of a combination of RF pulse 70 and a z axis gradient pulse $G_z$ (not shown) is that the nuclear spins of a narrow slice in the imaged object along an x-y plane are excited into resonance. Only those spins with a Larmor frequency, under the combined field $G_z$ and $B_0$, equal to the frequencies of the RF pulse 70 will be excited. Hence the position of the slice may be controlled by the gradient $G_z$ offset or the RF frequency.

After the 90 degree RF pulse 70, the precessing spins begin to dephase according to their chemical shifts which cause the spins of certain chemical species to precess faster than others and the action of the applied gradients which cause spatially dependent off resonance conditions. At time TE/2 after the application of 90 degree RF pulse 70, a 180 degree RF pulse 72 may be applied, which has the effect of rephasing the spins to produce a spin echo 74 at time TE after the 90 degree RF pulse 70. This spin echo signal 74 is acquired during a readout gradient 76. As is understood in the art, a dephaser pulse 78 is applied after the 90 degree RF pulse but before the readout gradient to center the spin echo within the read out gradient. The spin echo signal 74 is sampled at a rate which determines the resolution of the acquired image along the readout gradient axis. For example, 256 samples are typically acquired.

With the 180 degree RF pulse 72 centered at time TE/2, any constant off resonance-induced phase shifts, including the chemical shift of fat relative to water, will be completely rephased at the time of the spin echo 74. This timing produces an $S_0$ signal which, consequently, will have no off resonance phase encoding. The time of the 180 degree pulse 72, however, may be shifted forward to back by time, τ, from the time TE/2. In this case, the fat and water proton spins will not be in phase but will be shifted with respect to each other by $2\tau\omega_{cs}$, where $\omega_{cs}$ is the difference in Larmor frequencies between water and fat. The value of the phase shift between the fat and water images caused by their chemical shift will be designated θ. At the same time, any constant resonance offset $\omega_0$ will be phase encoded by an amount $\phi=2\omega_0\tau$. This sequence is repeated with different $G_y$ gradient pulses 80, as is understood in the art, to acquire a k-space NMR data set from which an image of the imaged object may be reconstructed according to conventional reconstruction techniques using the Fourier transform. The number of separate phase encodings employed in the scan determines image resolution along the phase encoding gradient axis. For example, 128 phase encodings are typically acquired.

In a two point Dixon method, two images $S_1$ are acquired using this pulse sequence. Each image $S_i$ has a different phase shift value θ between the water and fat components, as follows: $S_0$ where θ=0 and $S_1$ where θ=π. The MRI system is operated with the pulse sequence of FIG. 2 to acquire two images with θ=0 and π, such that a water image and a fat image may be reconstructed using the 2-point Dixon method. The 2-point Dixon method assumes that the tissue spectra are composed of two δ-peaks, one at 3.5 ppm and the other at the water resonance frequency. In the preferred embodiment the 2-point Dixon method is employed to minimize image data acquisition time, but it can be appreciated that other chemical-shift based water/fat separation methods, such as a 3-point Dixon method, may also be employed, including those that model fat spectrum as multiple peaks, in which case the present method can be used to remove any "left-over" of residual fat signal in the water image due to imperfect modeling of the fat spectrum.

According to embodiments of the invention, upon acquisition of the image data by way of the above described 2-point Dixon method (or another suitable chemical-shift based imaging technique) and reconstruction of water and fat images via known image reconstruction techniques, post-processing is performed to further refine the water image. That is, it is recognized that fat contains multiple spectral components; however, such multiple spectral components are not accounted for in chemical-shift based multi-point Dixon methods, where a single frequency representation for water and fat is employed. Multi-point Dixon methods use a single frequency representation for fat that resolves the main fat peak at 3.5 ppm into the fat-only image. The additional spectral components of fat thus partly appear in the water-only image, with the residual signal in the water-only image representing the fat signal corresponding to the remaining spectral components and appearing as "grey fat" in the water image. Post-processing is thus performed according to embodiments of the invention to provide further fat suppression in the final water-only image, so as to increase the contrast therein.

Figure 3:
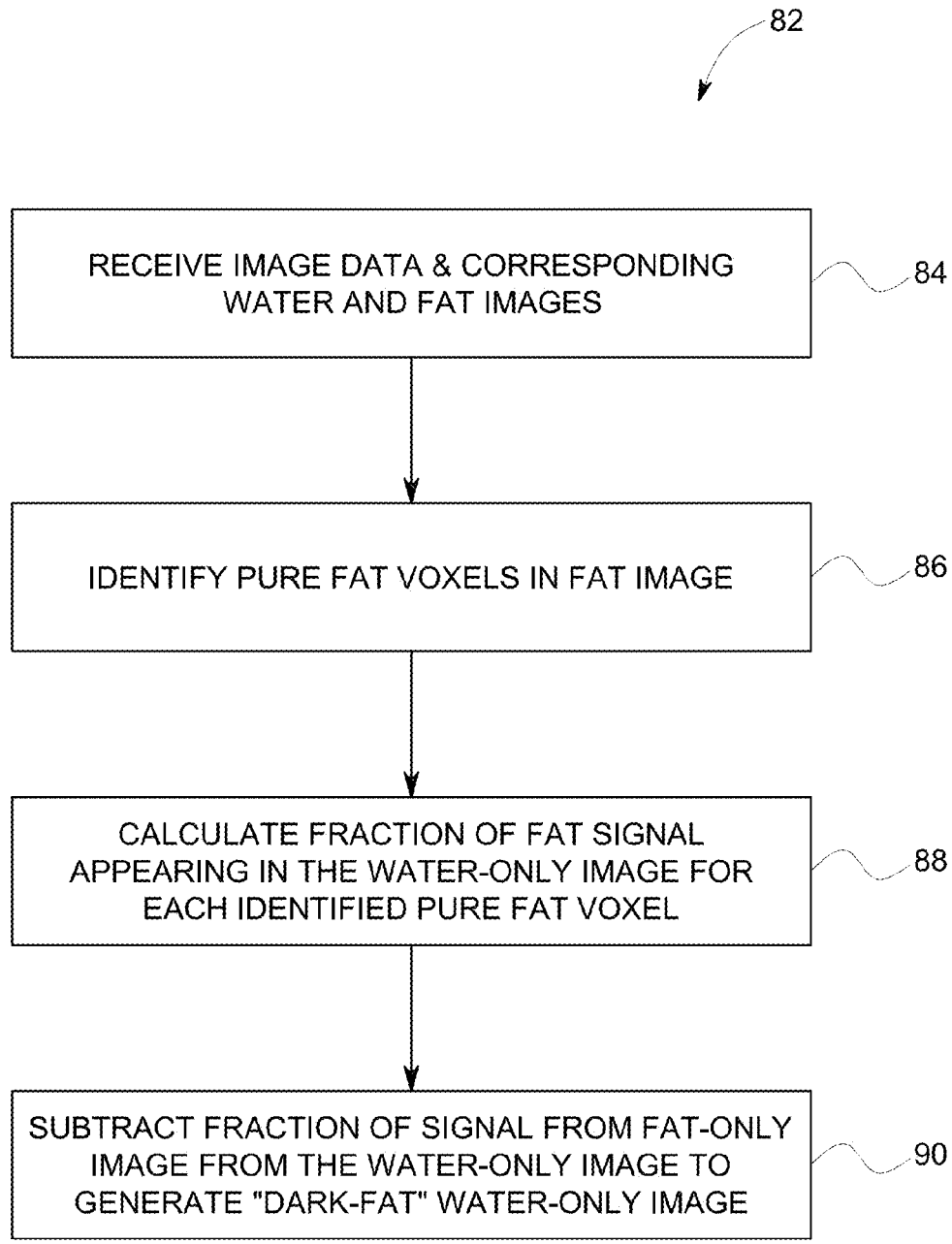
FIG. 3 is a flowchart illustrating a post-processing technique for further suppressing a fat signal in a water-only image according to an embodiment of the invention.

Referring to FIG. 3, a post-processing technique 82 is illustrated that is applied to the acquired/reconstructed water-only image to achieve complete fat suppression in the water-only image. Technique 82 is an automated technique that removes the "grey fat" appearance from the water-only image and instead provides a higher contrast water-only image having "dark fat" present therein. As shown in FIG. 3, technique 82 begins at block 84 with the receipt of image data acquired by way of any of a plurality of chemical-shift based imaging techniques. Thus, for example, the image data received at block 84 could have been acquired via a 2-point or 3-point Dixon based technique as described above.

Also received at block 84 are the corresponding water and fat images reconstructed from the acquired image data using a known image reconstruction technique. According to an embodiment where a Dixon based technique is implemented for image data acquisition, such that a single frequency model is used for both water and fat signals, the main fat peak is resolved at 3.5 ppm into the fat-only image, which is represented by "f_img". The additional spectral components of the multi-spectral fat signal partly appear in the water-only image, represented by "w_grey_img."

Upon receipt of reconstructed water and fat images at block 84, technique continues at block 86, where voxels in the fat image that are composed purely of fat are identified. The pure fat voxels in the fat image may be identified via one of several techniques, such as a thresholding technique, for example. According to one embodiment, a histogram analysis is employed, with a high signal intensity threshold being used in the histogram to identify the pure fat voxels.

For each of the pure fat voxels identified at block 86, the fraction of the fat signal appearing in the water-only image is then calculated at block 88. According to an exemplary embodiment, an average of the fraction of the fat signal appearing in the water-only image for the identified pure fat voxels is determined at block 88, with the average value of the fat signal fraction appearing in the water-only image being designated "f_fraction" according to:

$$\text{f\_fraction} = \text{mean}\left(\left(\frac{\text{w\_grey\_img}}{\text{f\_img}}\right)_{identified\_pure\_fat\_voxels}\right), \quad [\text{Eqn. 1}]$$

where w_grey_img is the additional spectral components of the multi-spectral fat signal appearing in the pure fat voxels of the water-only image and f_img is the spectral components of the fat signal appearing in the pure fat voxels of the fat-only image. As it is recognized that all pure fat pixels in the image should follow about the same signal behavior, f_fraction is spatially invariant for a given set of echo times and thus, beneficially, can be accurately extracted from the image data. Alternatively, f_fraction can be determined other ways through w_grey_img and f_img, for example, f_fraction=mean(w_grey_img)/mean(f_img) for all identified pure fat voxels. Instead of averaging (i.e. mean), the median operation can also be used to provide another type of "averaging".

While the average value of the fat signal fraction appearing in the water-only image, f_fraction, is set forth above as being determined by way of [Eqn. 1], it is recognized that in an alternative embodiment of the invention, f_fraction can be pre-calculated based on a known fat spectrum. That is, a constant value can be used for f_fraction based on the known resonant frequencies of the fat spectrum. However, in using such a pre-determined value for f_fraction, it is recognized that the fat spectrum may change from subject to subject, and may appear differently with various $T_1$ and $T_2$ weighted acquisitions, such that the use of a pre-determined value for f_fraction may not be as precise as a value determined by way of [Eqn. 1]. It is also possible to obtain f_fraction using a hybrid strategy from both a pre-determined value and the value calculated from the separated images as described above.

Referring still to FIG. 3, in a next step of technique 82, the fraction of signal from the fat-only image (i.e., the fraction of the fat signal appearing in the water-only image) is subtracted from the water-only image at block 90, so as to provide a modified or refined water-only image, that is a final "dark fat" water image, w_dark_img, with complete fat suppression. The dark fat water image is determined according to:

$$\text{w\_dark\_img} = \text{w\_grey\_img} - (\text{f\_fraction} * \text{f\_img}) \quad [\text{Eqn. 2}].$$

The subtraction of the fraction of signal from the fat-only image from the water-only image according to [Eqn. 2] serves to remove the "grey-fat" from the water-only image to achieve complete fat suppression, thus resulting in the final dark fat water image. The removal of the "grey-fat" from the water-only image and resulting dark fat water image generation provides increased contrast in the image, thus improving the confidence in any diagnosis based on the resulting image. It is important to note that in some applications, it may be preferred to have a fraction of fat signal in the water images. For those applications, the f_fraction can be adjusted purposely to include a desirable amount of residual fat signal. For example, when adding 0.5 to the f_fraction determined from [Eqn.1] as the new f_fraction, such f_fraction used in [Eqn.2] results in an image with a moderate out-of-phase effect (water and fat are out of phase).

Figures 4A, 4B, 5A, 5B:
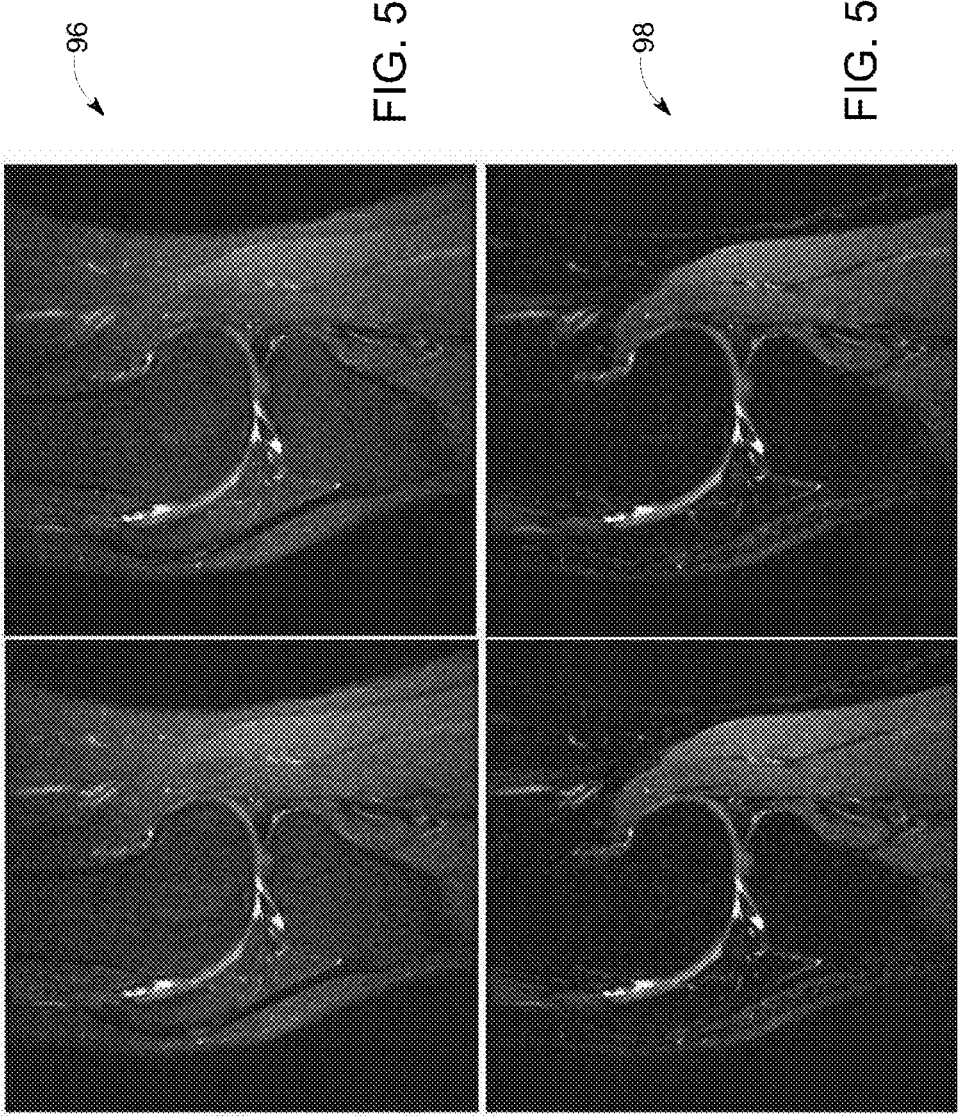
FIGS. 4A and 4B illustrate knee images acquired using a 2-point Dixon method without post-processing and with the post-processing technique of FIG. 3, respectively.
FIGS. 5A and 5B illustrate knee images acquired using a 3-point Dixon method without post-processing and with the post-processing technique of FIG. 3, respectively.

Exemplary images of a knee are provided in FIGS. 4A and 4B and in FIGS. 5A and 5B that illustrate the increased contrast provided via implementation of technique 82 of FIG. 3. FIGS. 4A and 4B illustrate knee images 92, 94 acquired using a 2-point Dixon method, with no post-processing (image 92 of FIG. 4A) and with post-processing (image 94 of FIG. 4B) implemented according to technique 82. FIGS. 5A and 5B illustrate knee images 96, 98 acquired using a 3-point IDEAL method, with no post-processing (image 96 of FIG. 5A) and with post-processing (image 98 of FIG. 5B) implemented according to technique 82. As seen, the knee images of FIGS. 4B and 5B that implement the post-processing of technique 82 have an increased contrast therein based on the complete fat suppression provided by removal of the "grey-fat" therefrom.

Embodiments of the present invention thus provide an automated technique to achieve complete fat suppression in water-only MR images acquired by chemical-shift based water-fat separation methods. The technique works on all chemical-shift based methods including 2-point, 3-point, and more than 3 points, with the complete fat suppression provided by the technique increasing the contrast and improving the confidence in diagnosis in certain clinical applications.

A technical contribution for the disclosed method and apparatus is that it provides for a computer implemented system and method for separating the NMR signal contributions from a plurality of different species having different chemical shifts.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD- ROMs, hard disk drives, and/or electronic memory. Other forms of non-transitory and/or tangible computer readable storage media not list may be employed with embodiments of the invention. A number of such components can be combined or divided in an implementation of a system. Further, such components may include a set and/or series of computer instructions written in or implemented with any of a number of programming languages, as will be appreciated by those skilled in the art.

Therefore, according to one embodiment of the invention, an MRI apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images of an object composed of at least a first species and a second species. The MRI apparatus also includes a computer programmed to cause the MRI system to apply a pulse sequence, acquire a plurality of MR image data sets including a first species signal and a second species signal, generate a first species image from the acquired MR image data, and generate a second species image from the acquired MR image data. The computer is also programmed to identify voxels in the second species image representative of only the second species and, for voxels identified as being representative of only the second species, calculate a fraction of the second species signal appearing in the first species image. The computer is further programmed to generate a modified first species image based on the fraction of the second species signal appearing in the first species image, the modified first species image having a different fraction of the second species as compared to the first species image.

According to another embodiment of the invention, a non-transitory computer readable storage medium is provided having stored thereon a computer program comprising instructions, which when executed by a computer, cause the computer to acquire multi-echo MR image data from a subject containing at least a first species and a second species and reconstruct a first species image from the acquired MR image data, the first species image having a suppressed signal from the second species. The instructions further cause the computer to reconstruct a second species image from the acquired MR image data that has a suppressed signal from the first species and further suppress the signal from the second species in the first species image to generate a modified first species image. The suppressing of the signal from the second species in the first species image further includes identifying voxels in the second species image representative of only the second species, calculating a fraction of the second species signal appearing in the first species image for those voxels identified as being representative of only the second species, and subtracting from the first species image, the fraction of the second species signal appearing in the first species image to generate the modified first species image.

According to yet another embodiment of the invention, a method for producing an image having a suppressed signal from a selected species with a magnetic resonance imaging (MRI) system includes acquiring, with an MRI system, multi-echo MR data for a subject containing at least a first species and a second species, the multi-echo MR data including a first species signal and a second species signal and reconstructing a first species image and a second species image from the acquired MR image data. The method also includes identifying voxels in the second species image representative of only the second species and calculating, for voxels identified as being representative of only the second species, a fraction of the second species signal component present in the second species image and appearing in the first species image. The method further includes generating a refined first species image based on the fraction of the second species signal component present in the second species image and appearing in the first species image.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
a magnetic resonance imaging (MRI) system having a plurality of gradient coils positioned about a bore of a magnet, and an RF transceiver system and an RF switch controlled by a pulse module to transmit RF signals to an RF coil assembly to acquire MR images of an object composed of at least a first species and a second species; and
a computer programmed to:
cause the MRI system to apply a pulse sequence;
acquire a plurality of MR image data sets including a first species signal and a second species signal;
generate a first species image from the acquired MR image data;
generate a second species image from the acquired MR image data;
identify voxels in the second species image representative of only the second species;
for voxels identified as being representative of only the second species, calculate a fraction of the second species signal appearing in the first species image; and
generate a modified first species image based on the fraction of the second species signal appearing in the first species image, the modified first species image having a different fraction of the second species as compared to the first species image.

2. The MRI apparatus of claim 1 wherein the second species has a resonant frequency spectrum with multiple peaks and each peak has a known resonant frequency; and
wherein the computer is further programmed to:
model the second species signal as having a single resonant frequency; and
resolve a main peak in the resonant frequency spectrum of the second species based on the single resonant frequency, such that the second species image is generated from the second species signal largely at the main peak frequency.

3. The MRI apparatus of claim 2 wherein the computer is further programmed to apply one of a two-point, three-point, or other multi-point Dixon method, to acquire the plurality of MR image data sets and to generate the first species image and the second species image.

4. The MRI apparatus of claim 1 wherein the computer is further programmed to apply a threshold analysis to the second species image to identify the voxels in the second species image representative of only the second species.

5. The MRI apparatus of claim 1 wherein the computer is further programmed to:

determine an average fraction of the second species signal appearing in the first species image, the average fraction being determined from the calculated fraction of the second species signal appearing in the first species image in the respective identified voxels; and generate the modified first species image based on the average fraction of the second species signal appearing in the first species image.

6. The MRI apparatus of claim 5 wherein the computer is further programmed to determine the average fraction of the second species signal appearing in the first species image according to:

$$f\_fraction = mean\left(\left(\frac{w\_grey\_img}{f\_img}\right)_{identified\_pure\_fat\_voxels}\right)$$

where w_grey_img is the spectral components of the second species signal appearing in the first species image and f_img is the spectral component of the second species signal appearing in the identified voxels of the second species image.

7. The MRI apparatus of claim 1 wherein the modified first species image has additional suppression of the second species as compared to the first species image.

8. The MRI apparatus of claim 1 wherein the computer is further programmed to subtract from the first species image, the fraction of the second species signal appearing in the first species image to generate the modified first species image.

9. The MRI apparatus of claim 8 wherein the computer is further programmed to subtract the fraction of the second species signal appearing in the first species image from the first species image according to:

w_dark_img=w_grey_img−(f_fraction*f_img)

where w_grey_img is the spectral components of the second species signal appearing in the first species image in addition to the signal from the first species, f_fraction is the fraction of the second species signal appearing in the first species image, and f_img is the spectral component of the second species signal appearing in the second species image.

10. The MRI apparatus of claim 1 wherein the first species comprises water and the second species comprises fat, and wherein the modified first species image comprises a water-only image having suppressed grey fat, so as to generate a dark fat water-only image.

11. A non-transitory computer readable storage medium having stored thereon a computer program comprising instructions, which when executed by a computer, cause the computer to:

acquire multi-echo MR image data from a subject containing at least a first species and a second species;

reconstruct a first species image from the acquired MR image data, the first species image having a suppressed signal from the second species;

reconstruct a second species image from the acquired MR image data, the second species image having a suppressed signal from the first species; and further suppress the signal from the second species in the first species image to generate a modified first species image, wherein further suppressing the signal from the second species in the first species image comprises:

identifying voxels in the second species image representative of only the second species;

for voxels identified as being representative of only the second species, calculating a fraction of the second species signal appearing in the first species image; and subtracting from the first species image, the fraction of the second species signal appearing in the first species image to generate the modified first species image.

12. The computer readable storage medium of claim 11 wherein the instructions further cause the computer to apply a threshold analysis to the second species image to identify the voxels in the second species image representative of only the second species.

13. The computer readable storage medium of claim 11 wherein the instructions further cause the computer to:

determine an average fraction of the second species signal appearing in the first species image, the average fraction being determined from the calculated fraction of the second species signal appearing in the first species image in the identified voxels; and generate the modified first species image based on the average fraction of the second species signal appearing in the first species image.

14. The computer readable storage medium of claim 11 wherein the instructions further cause the computer to determine the average fraction of the second species signal appearing in the first species image according to:

$$f\_fraction = mean\left(\left(\frac{w\_grey\_img}{f\_img}\right)_{identified\_pure\_fat\_voxels}\right)$$

where w_grey_img is the spectral components of the second species signal appearing in the first species image and f_img is the spectral component of the second species signal appearing in the identified voxels of the second species image.

15. The computer readable storage medium of claim 11 wherein the instructions further cause the computer to subtract the fraction of the second species signal appearing in the first species image from the first species image according to:

w_dark_img=w_grey_img−(f_fraction*f_img)

where w_grey_img is the spectral components of the second species signal appearing in the first species image in addition to the signal from the first species, f_fraction is the fraction of the second species signal appearing in the first species image, and f_img is the spectral component of the second species signal appearing in the second species image.

16. The computer readable storage medium of claim 11 wherein the first species comprises water and the second species comprises fat, and wherein the first species image comprises a water-only image and the second species image comprises a fat-only image.

17. A method for producing an image having a suppressed signal from a selected species with a magnetic resonance imaging (MRI) system, the method comprising:

acquiring, with an MRI system, multi-echo MR data for a subject containing at least a first species and a second species, the multi-echo MR data including a first species signal and a second species signal;

reconstructing a first species image and a second species image from the acquired MR image data;

identifying voxels in the second species image representative of only the second species;

calculating, for voxels identified as being representative of only the second species, a fraction of the second species signal component present in the second species image and appearing in the first species image; and generating a refined first species image based on the fraction of the second species signal component present in the second species image and appearing in the first species image.

18. The method of claim 17 wherein identifying the voxels representative of only the second species comprises applying a threshold analysis to the second species image.

19. The method of claim 17 wherein the fraction of the second species signal component present in the second species image and appearing in the first species image is calculated according to:

$$f\_fraction = \text{mean}\left(\left(\frac{w\_grey\_img}{f\_img}\right)_{identified\_pure\_fat\_voxels}\right)$$

where w_grey_img is the spectral components of the second species signal appearing in the first species image and f_img is the spectral component of the second species signal appearing in the identified voxels of the second species image.

20. The method of claim 17 wherein generating a refined first species image comprises subtracting from the first species image the fraction of the second species signal present in the second species image according to:

$$w\_dark\_img = w\_grey\_img - (f\_fraction * f\_img)$$

where w_grey_img is the spectral components of the second species signal appearing in the first species image in addition to the signal from the first species, f_fraction is the fraction of the second species signal appearing in the first species image, and f_img is the spectral component of the second species signal appearing in the second species image.

21. The method of claim 17 wherein the refined first species image further suppresses the signal from the second species, such that the refined first species image has a different contrast between the first species and the second species as compared to the first species image.

22. The method of claim 17 wherein the first species comprises water and the second species comprises fat.

* * * * *